(12) United States Patent
Ikuta et al.

(10) Patent No.: US 8,823,106 B2
(45) Date of Patent: Sep. 2, 2014

(54) ESD PROTECTIVE ELEMENT AND PLASMA DISPLAY INCLUDING THE ESD PROTECTIVE ELEMENT

(75) Inventors: Teruhisa Ikuta, Nara (JP); Yoshinobu Satou, Osaka (JP)

(73) Assignee: Panasonic Corporation, Osaka (JP)

( * ) Notice: Subject to any disclaimer, the term of this patent is extended or adjusted under 35 U.S.C. 154(b) by 499 days.

(21) Appl. No.: 12/941,616

(22) Filed: Nov. 8, 2010

(65) Prior Publication Data

US 2011/0169092 A1 Jul. 14, 2011

(30) Foreign Application Priority Data

Jan. 8, 2010 (JP) ................................. 2010-002676

(51) Int. Cl.
*H01L 23/62* (2006.01)
*H01L 27/02* (2006.01)

(52) U.S. Cl.
CPC ................................. *H01L 27/0259* (2013.01)
USPC ............................ 257/355; 257/356; 257/357

(58) Field of Classification Search
USPC .................. 257/141, 204, 355, 328, E29.261, 257/E29.197, E29.202
See application file for complete search history.

(56) References Cited

U.S. PATENT DOCUMENTS

| | | | |
|---|---|---|---|
| 4,989,057 A | 1/1991 | Lu | |
| 6,218,704 B1 | 4/2001 | Brown et al. | |
| 6,365,932 B1 * | 4/2002 | Kouno et al. | 257/341 |
| 6,563,193 B1 | 5/2003 | Kawaguchi et al. | |
| 2003/0052368 A1 | 3/2003 | Tsuji et al. | |
| 2006/0223258 A1 * | 10/2006 | Okushima | 438/202 |
| 2008/0001876 A1 | 1/2008 | Ito et al. | |
| 2008/0265278 A1 * | 10/2008 | Hara et al. | 257/141 |
| 2009/0206439 A1 | 8/2009 | Kitajima | |
| 2011/0169092 A1 * | 7/2011 | Ikuta et al. | 257/355 |

FOREIGN PATENT DOCUMENTS

| | | |
|---|---|---|
| JP | 49-104575 A | 10/1974 |
| JP | 01-65152 | 4/1989 |
| JP | 02-214164 | 8/1990 |
| JP | 05-013425 B2 | 1/1993 |
| JP | 2001-102387 A | 4/2001 |
| JP | 2007-334299 | 12/2007 |

OTHER PUBLICATIONS

Notice of Reasons for Refusal Japanese Patent Application No. 2010-002676 dated Oct. 4, 2013.

* cited by examiner

*Primary Examiner* — Bilkis Jahan
(74) *Attorney, Agent, or Firm* — McDermott Will & Emery LLP

(57) ABSTRACT

The present invention mainly provides an ESD protective element which can be built in high voltage semiconductor integrated circuit devices without increasing the chip area. An ESD protective element according to one embodiment has a construction comprising a semiconductor layer, a first region of a first conduction type formed in the semiconductor layer, a first region of a second conduction type formed in the semiconductor layer away from the first region of the first conduction type, a second region of the second conduction type formed in the first region of the second conduction type and has a higher impurity concentration than it, and a second region of the first conduction type formed in the second region of the second conduction type and has a high impurity concentration. The first and second regions of the second conduction type are in an electrically floating state.

20 Claims, 10 Drawing Sheets

ESD PROTECTIVE ELEMENT AND PLASMA DISPLAY INCLUDING THE ESD PROTECTIVE ELEMENT

CROSS REFERENCE TO RELATED APPLICATION

The present application claims the benefit of Japanese Patent Application No. 2010-002676 filed Jan. 8, 2010, the subject matter of which is incorporated herein by reference.

BACKGROUND OF THE INVENTION

1. Field of the Invention

The present invention relates to an ESD (Electro Static Discharge) protective element, especially an ESD protective element which can be embedded in a high voltage semiconductor integrated circuit formed on a silicon-on-insulator (SOI) substrate.

2. Description of the Related Art

In recent years, MOS-type integrated circuits formed on a silicon-on-insulator (SOI) substrates have expanded into various kinds. More specifically, such integrated circuits can be roughly divided into LSIs used in CPUs for example, of which a high-speed operation with low power consumption is required, and high-voltage ICs used in vehicles and flat display panels (FDP) for example. In general, in a semiconductor integrated circuit high voltage and/or high-current such as a noise surge caused by electrostatic discharge (ESD) may be input to or occasionally output from a voltage/current input/output pad electrode for example. However, semiconductor devices having an SOI structure have poor heat dissipation because it is surrounded with insulating films such as a silicon oxide film having low thermal conductivity, its temperature increase during an ESD event is larger than that of semiconductor devices using an ordinary bulk silicon substrate, it can be easily thermally destructed, and therefore it is believed to be inferior in terms of ESD overloading tolerance.

Such a situation is not limited to circuits comprising semiconductor devices, but also applies to an SOI-type ESD protective element embedded together with the circuit(s). Described in U.S. Pat. No. 4,989,057 (Prior Art Document 1) is a MOS-type ESD protective element structure in high-speed MOS-type semiconductor circuit which has an SOI structure and is driven at a lower voltage than a few voltage of the power supply V, wherein even if a surge is input, heat generation is suppressed to prevent destruction of the ESD protective element, and a satisfactory ESD overload tolerance can be secured. Shown in FIG. 7 is a cross-sectional view of the ESD protective transistor described in Prior Art Document 1.

In FIG. 7 an embedded insulating film 2 is formed on a supporting substrate 1, on which is formed an island-shape low-concentration P-type semiconductor layer 3, which is the basis of an ESD protective element. Then, both ends of the semiconductor layer 3 consist of an N-type source region 4 and a drain region 5. In addition, a gate electrode 7 is set on the semiconductor layer 3 via a thin gate insulating film 6. In an integrated circuit, the gate electrode 7 of the ESD protective transistor is connected to the source region 4 and further connected to a chip ground bus for example. The drain region 5 is connected to wirings and bonding pads having the possibility of surge input, and the P-type semiconductor layer 3 sandwiched by the source region 4 and the drain region 5 is set to an electrically floating state. In another connection mode of the ESD protective transistor, the source region 4 is connected to wiring and bonding pads having the possibility of surge input, and the drain region 5 is connected to the power supply line.

Shown in FIG. 8 shows current-voltage characteristics relating to the breakdown characteristics exhibited by the ESD protective transistor in FIG. 7 when a surge is input. When an applied voltage increases with a reverse bias of the transistor applied, the reverse breakdown voltage of about 12 V (Point A) is reached, and when the current slightly increases from that point a snap-back immediately occurs, with a holding voltage of about 7 V (Point B) which is the minimum voltage applied to the element. Then, as the current continues to increase, the voltage also keeps slightly increasing due to the resistance existing between the source region 4 and the drain region 5. Although not shown here, as the current further increases, breakdown occurs again, and the ESD protective transistor itself reaches a point of thermal destruction.

As described above, in the SOI-type ESD protective transistor described in Prior Art Document 1, when a large surge current is input, a snap-back immediately occurs due to the floating-body effect caused by setting its P-type semiconductor layer 3 into an electrically floating state, and the voltage between the both ends of the source/drain of the ESD protective transistor becomes about 7 V (holding voltage) which is close to half the reverse breakdown voltage of about 12 V. By this the power consumption due to the surge decreases, and the amount of heat generated in the ESD protective transistor decreases in comparison with conventional ones. Therefore, the SOI-type ESD protective transistor becomes capable of dealing with larger surge currents.

The above is an example of applying an ESD protective element to a high-speed SOI-type semiconductor integrated circuit. As semiconductor devices manufactured with an SOI structure, there are also the high (breakdown) voltage semiconductor integrated circuits mentioned above. Assumed as high-voltage semiconductor integrated circuits are MOS-type integrated circuits, such as a scan driver which drives/controls a PDP (plasma display panel), which require a power supply voltage of 150~300 V, typically about 200 V. Shown in FIG. 9 is the outline circuit diagram of a PDP scan driver IC circuit.

In FIG. 9, connected to the output terminal of the circuit are the PDP electrodes (not shown), and connected are a high voltage P-channel MOS transistor 22 (Pch3), a high voltage insulated gate bipolar transistor (IGBT) 25, and a high voltage diode 26. In the preceding stage of the output stage constituted of these output power elements, high voltage P-channel MOS transistors 20 (Pch1), 21 (Pch2), and high voltage N-channel MOS transistors 23 (Nch1) and 24 (Nch2), which perform the level-shifting operation, are connected, and further a 5-V system low-voltage CMOS control circuit 27 is connected to MOS transistors 23 and 24 and the gate electrode of the IGBT 25. The driving circuit in FIG. 9 is a unit-cell circuit, many of which are connected in parallel between the high-voltage power supply line and the ground (GND) line inside an actual PDP scan driver chip. Because high breakdown voltage elements such as the P-channel MOS transistor 22 and the IGBT 25 of which the output stage of the scan driver is constituted are relatively large in size, a certain degree of ESD tolerance is held by these elements themselves.

However, if the scan driver circuit has low output current in its specification, from the viewpoint of reducing the chip size and suppressing the manufacturing cost to the extent possible, the channel width immediately below the gate electrodes of the high voltage IGBT 25 and the high voltage P-channel MOS transistor 22 is reduced. However, because the ESD tolerance in the output stage decreases if the channel width is reduced, a new ESD protective element is installed.

Shown in FIG. 10 is a chip outline planar layout of a case in which the ESD protective element of Prior Art Document 1 as illustrated in FIG. 8 is placed inside a PDP scan driver (high voltage semiconductor integrated circuit device) chip. Inside a chip 29 such as the PDP scan driver, multiple unit circuit cells are arranged horizontally and vertically with the scan driver circuit in FIG. 9 as the unit circuit cell in a region 30 for forming high voltage semiconductor circuits constituted of an IGBT 25, a diode 26, and transistors 20~24, and in a region 33 for forming low-voltage semiconductor circuits such as the 5V-system CMOS control circuit 27.

The conventional ESD protective element is formed in an ESD protective element formation region 31 set up in every unit circuit cell. More specifically, by referring the scan driver circuit in FIG. 9, one ESD protective element is connected between the high-voltage power supply line and the output terminal on the side closer to the output terminal than to the P-channel MOS-type transistor 22, and another between the output terminal and the ground line on the side closer to the output terminal than to the IGBT 25 or the high voltage diode 26. One reason that this is necessary for every unit cell is because a conventional ESD protective element has a smaller current capacity at the trigger voltage.

SUMMARY OF THE INVENTION

However, applying the SOI-type ESD protective transistor disclosed by Prior Art Document 1 to a high-voltage semiconductor integrated circuit of an SOI structure such as the scan driver is difficult for the following reasons.

If the length of the source/drain direction of the P-type semiconductor layer 3 in order to adapt the ESD protective transistor of Prior Art Document 1 as an ESD protective element for a semiconductor device of a higher driving voltage, the holding voltage (Point B) in FIG. 8 could be increased by a certain degree (10 V plus for example). However, due to the fact that the gate insulating film 6 is thin and a high electric field is generated near the drain region 5 by a surge high voltage input to the drain region 5, an avalanche multiplication easily occurs, and it is believed that breakdown also could easily occur before the source/drain voltage reaches the operation voltage of a high-voltage circuit (power supply voltage) for example. Therefore, it is not easy to increase the breakdown voltage (trigger voltage: Point A) (up to about 200 V for example) to adapt an ESD protective element to a high-voltage circuit. In this respect also, the transistor of Prior Art Document 1 is not appropriate as the ESD protective element for a high voltage semiconductor device even if the size is increased.

It is also a problem as in FIG. 8 that the holding voltage decreases to nearly half the reverse breakdown voltage (Point A). Because the holding voltage needs to be set above the operation (or power supply) voltage of the high voltage semiconductor integrated circuit, in order to allow it, a large margin of the reverse breakdown voltage needs to be secured relative to the operating power supply voltage. However, because the larger the reverse breakdown voltage is set, the larger the size of the ESD protective element must be made, the chip area increases, eventually leading to a manufacturing cost increase. Based on the above also, a conventional ESD protective element having such characteristics as shown in FIG. 8 is not appropriate for high breakdown voltage circuits.

Further considering from the aspect of chip layout of a circuit such as a scan driver, as shown in FIG. 10, although the conventional ESD protective elements are large in size compared with elements constituting the circuit, they need to be installed on the chip 29 by twice the number of unit circuit cells, making an increased chip area inevitable. Conversely, ESD tolerance could be retained without installing any ESD protective element by modifying the structures of the IGBT 25 and/or the P-channel MOS transistor 22. However, in that case, even if the channel width is reduced, a substitute part elsewhere has to be modified to increase the chip area as the whole, making it difficult to reduce the chip size.

The present invention solves the problems described above. An objective of the present invention is to provide an ESD protective element which does not significantly increase the chip area of the high voltage semiconductor integrated circuit device. An another objective on the present invention is to provide an ESD protective element which can be easily built in high voltage semiconductor integrated circuit devices having an SOI structure without increasing the manufacturing cost.

A first ESD protective element according to the present invention has construction which provides a semiconductor layer, a first semiconductor region of a first conduction type formed in the semiconductor layer, a first semiconductor region of a second conduction type formed in the semiconductor layer in proximity or next to the first semiconductor region of the first conduction type, a second semiconductor region of the second conduction type formed in the first semiconductor region of the second conduction type, and a second semiconductor region of the first conduction type formed in the second semiconductor region of the second conduction type. The impurity concentration in the second semiconductor region of the second conduction type is higher than the impurity concentration in the first semiconductor region of the second conduction type, and the first semiconductor region of the second conduction type and the second semiconductor region of the second conduction type are set electrically floating.

A second ESD protective element according to the present invention has construction which provides a semiconductor layer, a first semiconductor region of a second conduction type formed in the semiconductor layer, a first semiconductor region of a first conduction type formed in the first semiconductor region of the second conduction type, a second semiconductor region of the second conduction type formed in the first semiconductor region of the second conduction type, away from the first semiconductor region of the first conduction type, and a second semiconductor region of the first conduction type formed in the second semiconductor region of the second conduction type. The impurity concentration in the second semiconductor region of the second conduction type is higher than the impurity concentration in the first semiconductor region of the second conduction type, and the first semiconductor region of the second conduction type and the second semiconductor region of the second conduction type are set to be electrically floating.

As one embodiment of above ESD protective elements, the first semiconductor region of the second conduction type and the second semiconductor region of the second conduction type have no electrode connected. As a result, those two semiconductor regions become electrically floating.

Because the semiconductor region of the second conduction type is constituted of the first semiconductor region and the second semiconductor region in the ESD protective elements, the impurity concentration in the first semiconductor region of the second conduction type can be reduced, and the impurity concentration in the second semiconductor region of the second conduction type can be adjusted higher to achieve an effect of increasing the breakdown voltage in the DC measurements and the trigger voltage leading to a snap-back of the ESD protective elements. Thus those voltage values become suitable for high voltage semiconductor integrated circuits, and at the same time they can be set to desired values.

By setting the impurity concentration in the second semiconductor region of the second conduction type to be higher than the impurity concentration in the first semiconductor region of the second conduction type and making the first and second semiconductor regions of the second conduction type to be electrically floating, it becomes possible to increase the current stand-up slope in the current-voltage characteristics between a breakdown point and a destruction point of the ESD protective element to make it abrupt. It becomes also possible to increase the current at which snap-back occurs.

The ESD protective elements may be formed in the semiconductor layer and included in a semiconductor device together with a semiconductor circuit protected by the ESD protective elements. In that case, they can be arranged so that the first semiconductor regions of the first conduction type are electrically connected to the ground line of the semiconductor circuit, and that the second semiconductor regions of the first conduction type are electrically connected to the power supply line of the semiconductor circuit.

If the semiconductor circuit contains multiple unit circuit cells, due to the increased current at the snap-back, the same ESD protective element can be shared by many identical unit circuit cells connected in parallel between the power supply line and the ground line, so that the number of ESD protective elements can be reduced, and at least the number of the ESD protective elements built in the semiconductor device can be made smaller than the number of said unit circuit cells, suppressing the increase in the chip area of the semiconductor integrated circuit.

In addition, the semiconductor layer may be preferably formed on an insulating film installed on a supporting substrate. In this case, the ESD protective element can be formed in a semiconductor layer of SOI-type high voltage semiconductor integrated circuits, suppressing the manufacturing cost.

Further, it is desirable that the ESD protective elements further provide a first electrode connecting to the first semiconductor region of the first conduction type, a second electrode connecting to the second semiconductor region of the first conduction type, and an interlayer insulating film covering the upper part of the first semiconductor region of the second conduction type, and that the first electrode extends onto the first semiconductor region of the second conduction type toward the second semiconductor region of the first conduction type via the interlayer insulating film.

Alternatively, it is desirable that the ESD protective elements further provide a first electrode connecting to the first semiconductor region of the first conduction type, a second electrode connecting to the second semiconductor region of the first conduction type, a filed insulating film covering the upper part of the first semiconductor region of the second conduction type, an interlayer insulating film formed on the field insulating film, and a conductive plate installed between the field insulating film and the interlayer insulating film and above the first semiconductor region of the second conduction type, wherein the first electrode is electrically connected with said conductive plate.

The foregoing and other objectives, features, aspects and advantages of the present invention will become more apparent from the following detailed description of the present invention when taken in conjunction with the accompanying drawings.

DETAILED DESCRIPTION OF PREFERRED EMBODIMENTS (First Embodiment)

Figure 1:
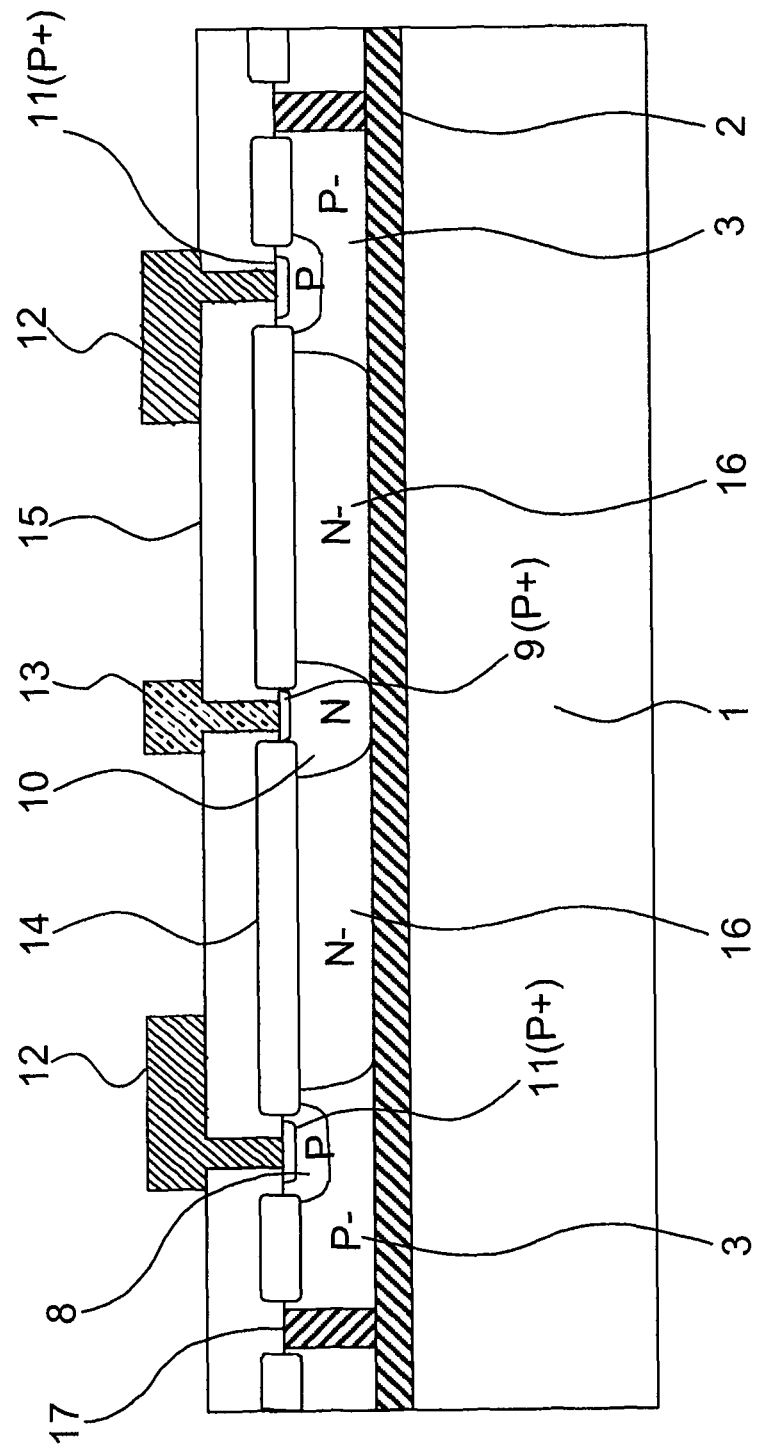
FIG. 1 is a cross-sectional view of an ESD protective element of the first embodiment of the present invention.

Shown in FIG. 1 is a cross-sectional view of an ESD protective element by the first embodiment of the present invention. In FIG. 1 an embedded insulating film 2 made of silicon oxide film is formed with a film thickness of 2.0 μm on a supporting substrate 1 constituting a part of an SOI substrate. Further, a low impurity concentration P-type semiconductor layer 3 made of single crystal silicon which becomes a base of an ESD protective element and corresponds to an active layer is formed with a film thickness of 3.5 μm on the embedded insulating film 2 by placing it onto the supporting substrate 1 and the embedded insulating film 2. An element separation region 17 is a region wherein a groove is formed in the semiconductor layer 3 until reaching the embedded insulating film 2, an insulating film such as silicon oxide film is embedded in the groove, and surrounds the entire circumference of the semiconductor layer 3 where an ESD protective element should mainly be formed.

Formed in a specified region of the semiconductor layer 3 surrounded with the element separation region 17 is a medium impurity concentration P-type first semiconductor region 8 having a higher impurity concentration than the semiconductor layer 3, and the peak value of the P-type impurity concentration is somewhat above $1 \times 10^{18}$ [cm$^{-3}$]. In addition, formed in the semiconductor layer 3 is a low impurity concentration N-type first semiconductor region 16 in proximity to but keeping a space from the P-type first semiconductor region 8, and the peak value of the N-type impurity concentration is somewhat below $1 \times 10^{16}$ [cm$^{-3}$]. This N-type first semiconductor region 16 may be in contact with the P-type first semiconductor region 8.

Formed in the N-type first semiconductor region 16 is a medium concentration N-type second semiconductor region 10 having a higher impurity concentration than the former, and the peak value of the impurity concentration in that region is about $3 \times 10^{18}$ [cm$^{-3}$]. Formed on the surface portion of the N-type second semiconductor region 10 is a high impurity concentration P-type second semiconductor region 9, and the peak value of its P-type impurity concentration is about $1 \times 10^{21}$ [cm$^{-3}$]. A high impurity concentration P-type semiconductor region 11 is also provided in the P-type first semiconductor region 8, and this P-type semiconductor region is for making an ohmic contact with metallic electrodes and formed simultaneously with the P-type second semiconductor region 9 by ion implantation for example. Hereafter, this semiconductor region 11 will be called as a P-type diffusion region for ohmic contact.

A field insulating film 14 formed by the LOCOS method is installed on the surfaces of the semiconductor layer 3, a part of the P-type first semiconductor region 8, the N-type first semiconductor region 16, and a part of the N-type second semiconductor region 10, and further an interlayer insulating film 15 made of BPSG for example, whose surface is flattened by reflow treatment, is placed on the whole substrate surface. A first electrode 12 and a second electrode 13 which are made of aluminum alloy film are installed, which are electrically connected to the P-type diffusion region for ohmic contact 11 and the P-type second semiconductor region 9, respectively, through a contact hole opened on a specified spot of the interlayer insulating film 15. Especially, the first electrode 12 is formed so as to extend onto the N-type first semiconductor region 16 in the direction from the P-type diffusion region for ohmic contact 11 to the P-type second semiconductor region 9. An insulating protective film (not shown) such as an SiN film is formed which becomes a barrier against external contaminations due to water and mobile ions on the interlayer insulating film 15 and the first and second electrodes 12 and 13. Here, no electrode is basically installed in the N-type first semiconductor region 16 and the N-type second semiconductor region 10, and no connection is made to other semiconductor regions such as the diffusion layer formed in the semiconductor layer 3, thus they are set to an electrically floating state.

The above is the construction of an ESD protective element in a cross-sectional view. Seen in the planar layout, the P-type second semiconductor region 9, the N-type second semiconductor region 10, and the second electrode 13 extend linearly in the perpendicular direction to the page while keeping their relative positional relationship shown in FIG. 1, and that direction is its length. At least the N-type first semiconductor region 16 and the P-type first semiconductor region 8 have a ring-shape pattern and surround the P-type second semiconductor region 9, the N-type second semiconductor region 10, and the second electrode 13. Further, the first electrode 12, the P-type diffusion region for ohmic contact 11 may be give a ring-shape pattern so as to surround the P-type second semiconductor region 9, the N-type second semiconductor region 10, and the second electrode 13, or a pattern extending linearly in the perpendicular direction to the page. The fact that the ESD protective element has a bilateral symmetry centering the N-type second semiconductor region 10 for example in FIG. 1 reflects the above-explained pattern layout. Although FIG. 1 shows only the ESD protective element part of the present invention, in the semiconductor layer 3 outside the element separation region 17 high breakdown voltage semiconductor circuits such as a scan driver circuit (including a high-voltage MOS-type transistor, an IGBT, and others).

Figure 2:
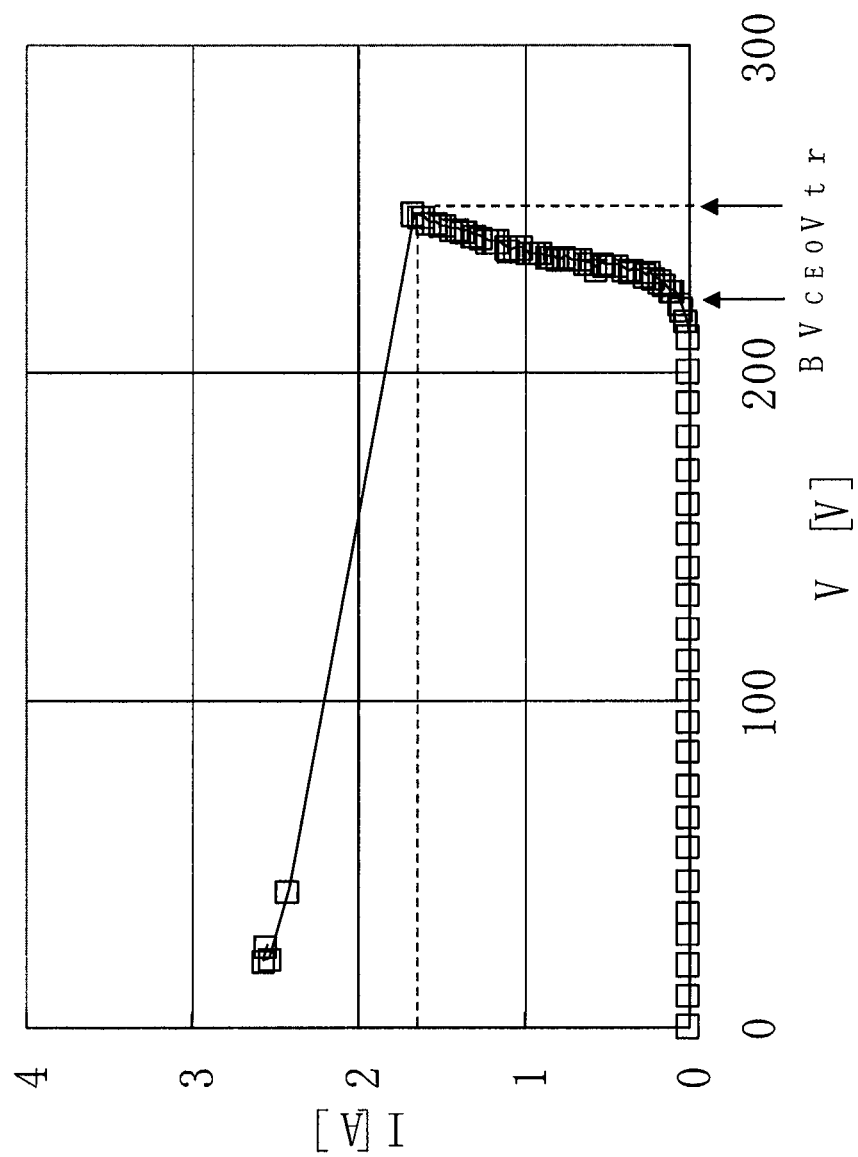
FIG. 2 is a plot showing the breakdown characteristics of the ESD protective element of the first embodiment of the present invention

Next, the characteristics of the ESD protective element in FIG. 1 are explained. The ESD protective element by the present invention can be electrically regarded as a PNP-type bipolar transistor with the P-type semiconductor layer 3 and the P-type first semiconductor region 8 as the collector, the N-type first semiconductor region 16 and the N-type second semiconductor region 10 as the base in an electrically floating state, and the P-type second semiconductor region 9 as the emitter. FIG. 2 is a plot showing the measurement result of the current-voltage (I-V) characteristics relating to the breakdown of the ESD protective element by the present invention. This measurement result was obtained by the TLP (Transmission Line Pulsing) method with the first electrode 12 (collector) grounded and the second electrode 13 (emitter) as the input/output terminal for pulse-shape high voltage such as a surge applied between the collector and the emitter as a reverse bias. In the TLP method, a test device is charged with multiple rectangular wave pulses through a coaxial cable while changing pulse voltage or current values in order, and a current-voltage curve is obtained based on input pulses and reflecting pulses from the device. Currently, the TLP method is widely used as an ESD property measurement method and reflects well the behavior or current-voltage characteristics of an ESD protective element when a surge is actually input.

As shown in FIG. 2, when a surge is input and voltage increases, it reaches the collector-emitter breakdown voltage $BV_{CEO}$ (215 V) of a bipolar transistor obtained by the DC measurement method. Here, the breakdown voltage in the DC measurement method is usually defined as the voltage at a point when the current abruptly increases from a minute value of 1 nA to 1 µA. When the voltage further increases, the I-V curve stands up linearly with a steep slope from the point of breakdown voltage $BV_{CEO}$, and when having reached the trigger voltage Vtr (voltage 248 V, current 1.66 A) and a snap-back occurs, thermal damage is sustained by the large current and irreversible destruction occurs.

In this manner, the ESD protective element according to the present invention does not show that after the voltage decreases from the trigger voltage and shows the holding voltage, the element is not destroyed and shows the current continue to increase. Its breakdown characteristics is different from the conventional protective elements. In comparison with conventional SOI-MOS-type ESD protective transistors, its characteristics are that the breakdown voltage $BV_{CEO}$ and the trigger voltage Vtr can be increased to approximately the same level as the power supply voltages of high voltage semiconductor integrated circuits and the breakdown voltages of high-voltage semiconductor elements such as IGBT and that while transitioning from the breakdown voltage $BV_{CEO}$ to the trigger voltage Vtr immediately before a snap-back, a large current can flow without increasing the voltage so much. The reasons are explained below.

In the ESD protective element of the present invention, by adopting such a structure as shown in FIG. 1 the breakdown voltage $BV_{CEO}$ and the trigger voltage Vtr can be relatively easily set to desired values based on general formulae on the breakdown voltage of bipolar transistors as described below.

In general, the following formulae hold true on the breakdown voltage in bipolar transistors utilizing a bulk silicon substrate.

$$BV_{CEO} = BV_{CBO} \cdot (1-\alpha)^{1/n} \quad (1)$$

$$I_{CEO} = I_{CBO}/(1-\alpha \cdot M) \quad (2)$$

Here, $BV_{CEO}$ is the collector-emitter breakdown voltage, $BV_{CBO}$ is the collector-base breakdown voltage, α is a current gain when the base is grounded, M is an avalanche multiplication coefficient, $I_{CEO}$ is a reverse current proportional to the avalanche multiplication coefficient M at the collector-base PN junction, and n is ordinarily 4~6. Because α is usually 1 or smaller, $BV_{CEO}$ is always lower than $BV_{CBO}$ and decreases as α approaches 1 according to Eq. (1). Equations (1) and (2) are believed to hold true for transistors wherein the base is in an electrically floating state.

Then, when the first electrode 12 of an ESD protective element is grounded and a high voltage is applied to the second electrode 13 due to ESD for example, a PN junction between the P-type semiconductor layer 3 and the N-type semiconductor region 16 becomes reversely biased, and because the N-type first semiconductor region 16 has a low impurity concentration, its interior becomes depleted. As opposed to this, because the N-type second semiconductor region 10 has about two-order higher impurity concentration than the N-type first semiconductor region 16, it is extremely hard to be depleted. Because $BV_{CBO}$ is regarded as the breakdown voltage between the P-type semiconductor layer 3 and the N-type first semiconductor region 16, by reducing the impurity concentration in the N-type first semiconductor region 16, $BV_{CBO}$ can be increased, and $BV_{CEO}$ can be improved according to Eq. (1).

On the other hand, according to the operation theory of bipolar transistors, the current gain α for the PNP type can be given with a good accuracy as:

$$\alpha = 1 - (n_{0E}/p_{0B}) \cdot (W/L_e) \cdot (D_e/D_h) \quad (3)$$

Here, $n_{0E}$ is the concentration of minority carriers (electrons) in the emitter, $p_{0B}$ is the concentration of minority carriers (holes) in the base, W is the base width, $L_e$ is the diffusion length of electrons, and $D_e$ and $D_h$ are the diffusion coefficients of electrons and holes, respectively. In addition, in the base $$n_B p_{0B} = n_i^2 \quad (4)$$

holds true. Here, $n_B$ is the concentration of majority carriers (electrons) in the base, and $n_i$ is the concentration of carriers in the intrinsic region.

According to Eq. (3), by decreasing $p_{0B}$, that is increasing $n_B$ by increasing the impurity concentration in the base according to Eq. (4), α can be decreased, and according to Eq. (1) the breakdown voltage $BV_{CEO}$ can be increased. To be more specific, this is achieved by increasing the impurity concentration in the N-type second semiconductor region 10. In this manner, because the ESD protective element according to the present invention has its base-equivalent region constituted of the N-type first semiconductor region 16 and the N-type second semiconductor region 10, $BV_{CEO}$ and α can be controlled separately by adjusting the impurity concentration in the former and the impurity concentration in the latter, respectively, allowing $BV_{CEO}$ to be increased easily. Therefore, the trigger voltage Vtr can also be increased following $BV_{CEO}$.

The ESD protective element according to the present invention can also increase the slope of current stand-up from the breakdown voltage $BV_{CEO}$ to the trigger voltage Vtr as described above. This is believed to be caused by the fact that the N-type first semiconductor region 16 and the N-type second semiconductor region 10 are electrically in a floating state. The ESD protective element according to the present invention further has a property that if current does not increase significantly from the breakdown voltage $BV_{CEO}$, no snap-back will occur. This property can be qualitatively explained in the following manner. First, when a voltage applied to the ESD protective element further increases from $BV_{CEO}$, the current $I_{CEO}$ increases, and the current gain α also increases. This is because the current gain α is generally believed to depend on the collector current. Also, along with an electric field increase by the increase of applied voltage, the avalanche multiplication coefficient M also increases. In such a state, the current $I_{CEO}$ flowing in the ESD protective element also increases according to Eq. (2). Then, if the current gain α increases and approaches 1, even if the avalanche multiplication coefficient M decreases, a snap-back (negative-resistance state) occurs, wherein $I_{CEO}$ increases by the current gain α further approaching 1. Based on the above, this point of entering the snap-back stage can be regarded as equivalent to the point of the transition from the state wherein $I_{CEO}$ increase occurs mainly by the increase of the avalanche multiplication coefficient M to the state wherein it occurs mainly by the increase of the current gain α.

In the ESD protective element according to the present invention, because a margin is secured by increasing the impurity concentration in the N-type second semiconductor region 10, the current gain α becomes smaller. And as is understood from the above explanation, it is estimated that in that structure the current gain α must be increased by having a larger current $I_{CEO}$ flow to enter a snap-back state. In this way, it is believed that the ESD protective element according to the present invention requires a larger current to cause a snap-back. The reason that a snap-back is hard to occur in the ESD protective element according to the present invention is that α can be reduced by increasing the impurity concentration in the N-type second semiconductor region 10 and that the $I_{CEO}$ current dependence of α can be reduced.

As explained above, sufficiently high breakdown voltage $BV_{CEO}$ and trigger voltage Vtr for protecting high voltage semiconductor integrated circuits against surges caused by ESD for example can be obtained with an easy setting by the protective element structure according to the present invention. In addition, as is clear from its cross-sectional structure shown in FIG. 1, because this protective element can be formed in a single-crystal semiconductor layer wherein elements of SOI-type high voltage semiconductor integrated circuits are formed, it has a good match with the manufacturing process and can suppressing the manufacturing cost as an advantage.

(Second Embodiment)

Figure 3:
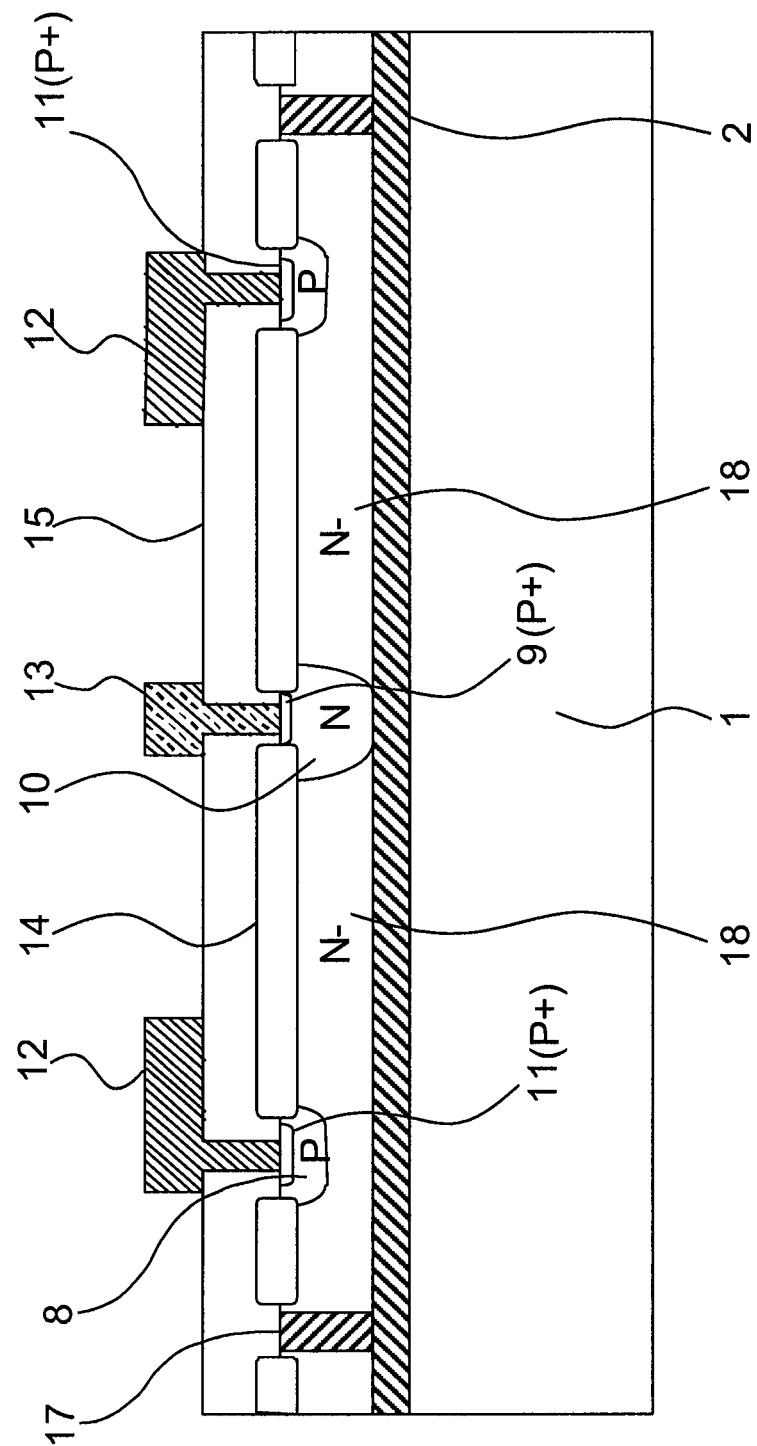
FIG. 3 is a cross-sectional view of an ESD protective element of the second embodiment of the present invention.
Figure 4:
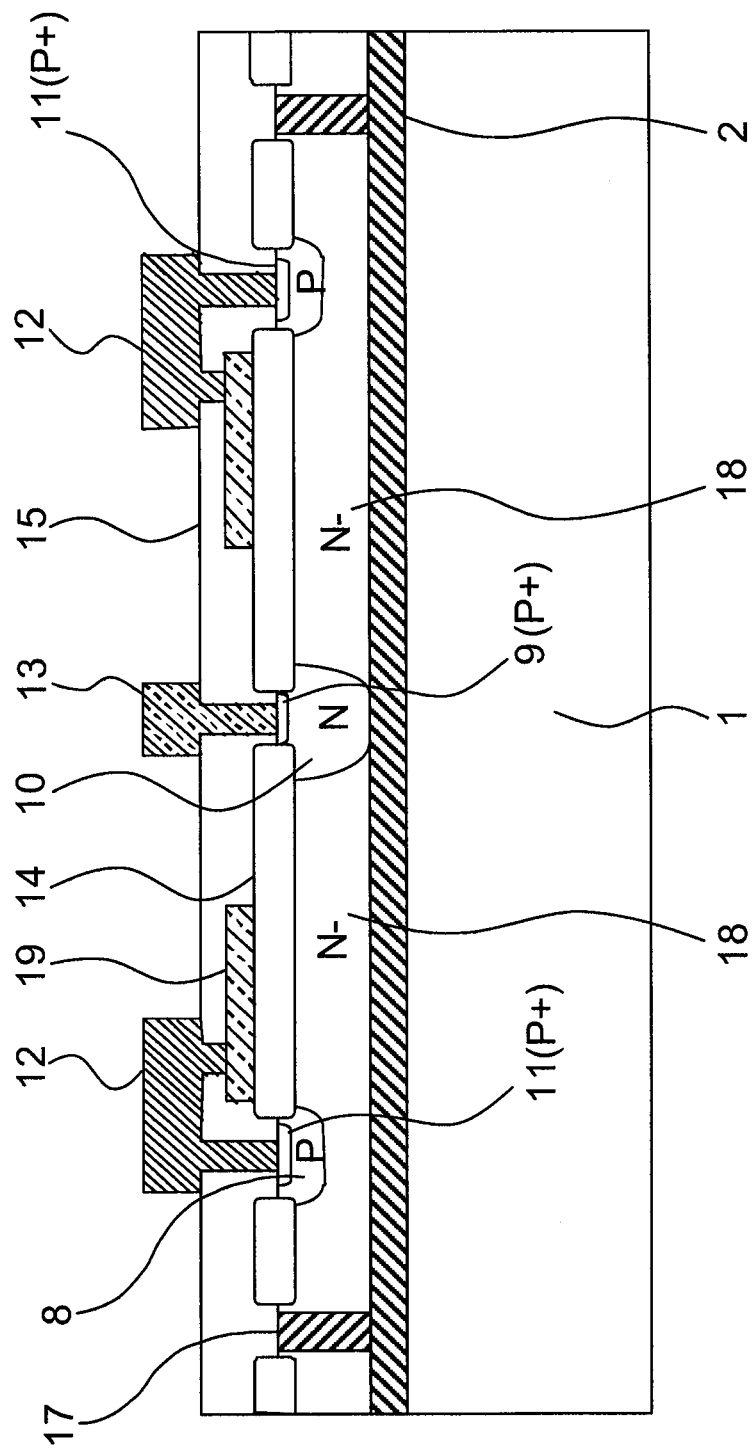
FIG. 4 is a cross-sectional view of another ESD protective element of the second embodiment of the present invention.

Shown in FIGS. 3 and 4 are cross-sectional views showing the structures of ESD protective elements according to the second embodiment of the present invention. Because these protective elements have similar structures to that of the first embodiment (FIG. 1), the same reference numerals are assigned to the parts having the same structure and function, their explanations are omitted. Descriptions are mainly given on the parts having different characteristics from those in the protective element of the first embodiment. In the ESD protective element in FIG. 3, an N-type semiconductor layer having a low impurity concentration is substituted for the P-type semiconductor layer 3 in the ESD protective element in the first embodiment. The N-type semiconductor layer consists of at least a part of a single crystal silicon layer formed on an embedded insulating film 2, that is, a whole region surrounded with an element separation region 17 wherein an ESD protective element is to be formed. This semiconductor layer itself is an N-type first semiconductor region 18 formed below a field insulating film 14 and corresponds to the N-type first semiconductor region 16 in the first embodiment. Even having such a structure, similar functions to the protective element in the first embodiment can be achieved. In this structure, because a single crystal silicon layer itself is the N-type first semiconductor region 18, the number of manufacturing processes can be reduced by one compared to the first embodiment wherein the N-type first semiconductor region 16 is formed after forming the low-concentration P-type semiconductor layer 3 by introducing impurity to it, which contributes to cost reduction.

An ESD protective element shown in FIG. 4 is the protective element, wherein a conductive plate 19 is newly inserted between the field insulation film 14 placed on the N-type first semiconductor region 18 and the interlayer insulating film 15 to electrically connect to the first electrode 12 in the protective element in FIG. 3. This conductive plate 19 extends toward the N-type second semiconductor region 10 above the N-type first semiconductor region 18 under the field insulating film 14 and functions as a field plate. In other words, in the case that the conductive plate 19 is set to the same potential with the first electrode 12 which is at the ground potential, when a high voltage such as a surge is applied to the second electrode 13 and a high potential distribution is generated according to depletion inside the N-type first semiconductor region 18, the potential distribution is modified, the electric fields in parts which have electric field concentrated and tend to have a breakdown is reduced, and the breakdown voltage of the ESD protective element is improved.

Also in the protective elements in FIGS. 1 and 3, because the first electrode 12 is placed so as to extend up to a certain distance above the N-type first semiconductor regions 16 and 18, respectively, it functions as a field plate. However, the conductive plate 19 of the protective element in FIG. 4 is placed directly on the surface of the field insulating film 14 which is closer to the N-type first semiconductor region 18 than to the first electrode 12, it has a larger effect in modifying the potential distribution and may greatly reduce the electric field in cases.

(Third Embodiment)

Figure 5:
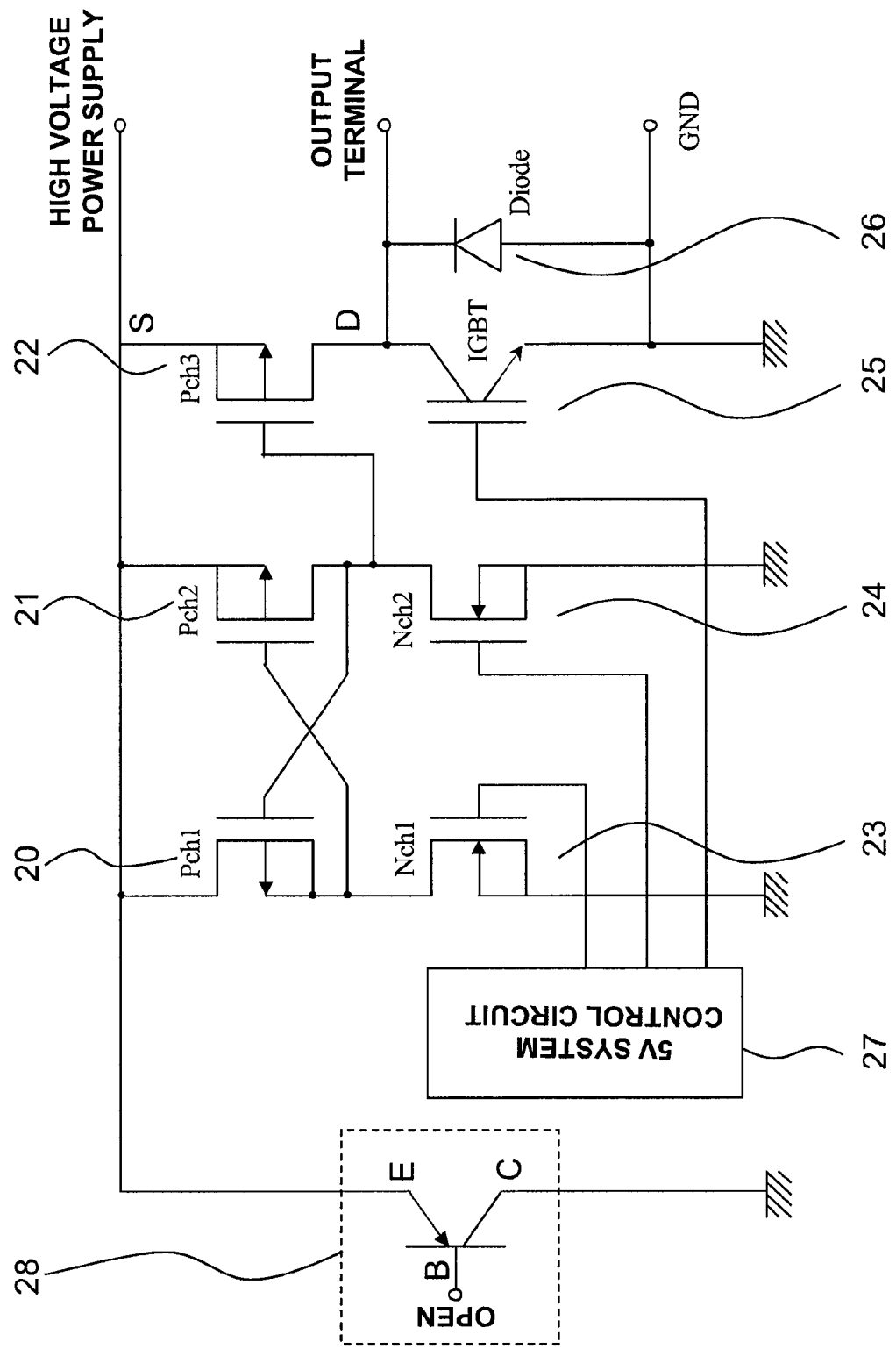
FIG. 5 is an outline drawing of a PDP scan driver circuit of the third embodiment of the present invention.
Figure 9:
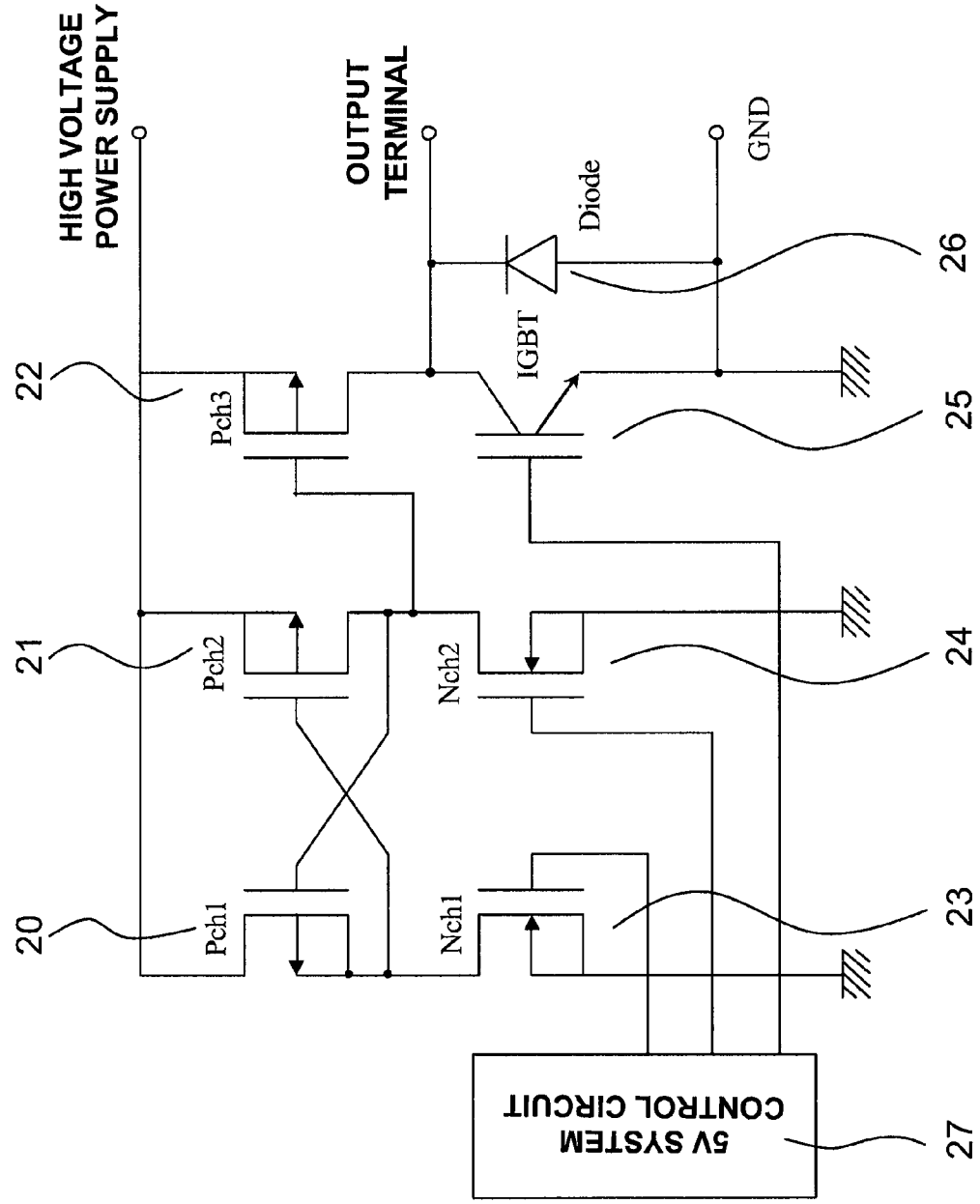
FIG. 9 is an outline diagram showing the construction of a PDP scan driver circuit.

Next, as the third embodiment of the present invention, a connecting method of an ESD protective element with the circuit is explained. Shown in FIG. 5 is an outline circuit diagram for a case wherein an ESD protective element according to the first or second embodiment built in a high breakdown voltage semiconductor circuit cell of a PDP scan driver IC in FIG. 9. An ESD element 28 according to the present invention can be regarded as a kind of PNP-type bipolar transistor with its base open in terms of circuit equivalency, a second electrode 13 (P-type second semiconductor region 9) corresponding to an emitter is connected to a high voltage power supply line of the scan driver circuit, and a first electrode 12 (P-type diffusion region 11 and P-type first semiconductor region 8 for ohmic contact) corresponding to a collector is connected to the ground line.

Figure 8:
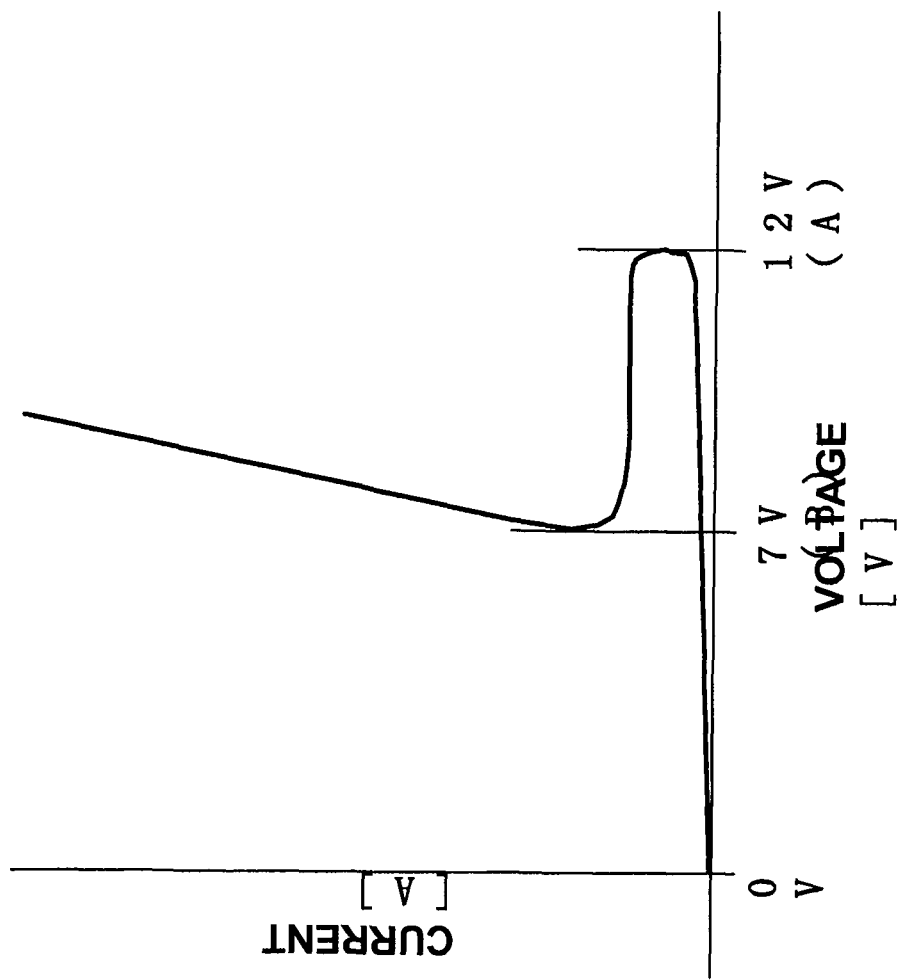
FIG. 8 is a plot showing the breakdown characteristics of a conventional ESD protective transistor.

As shown in FIG. 5 a high voltage P-channel MOS-type transistor 22 as the first element constituting the output stage of the circuit has its P-type source (S) and N-type body including a channel region set to the power supply voltage, and its drain side (D) connected to the output terminal. A high voltage IGBT 25 as the second element constituting the output stage has a gate electrode, a P-type collector, and a P-type emitter, and shows similar ESD breakdown characteristics to that of an SOI-MOS-type transistor shown in FIG. 8. Therefore, it has a breakdown voltage defined in the DC measurement, certain trigger voltage and holding voltage measured by TLP method.

Next, the actions of a circuit shown in FIG. 5 for ESD are explained. When a voltage far higher than the power supply voltage is input through the output terminal due to a positive surge, the drain (D) PN junction of a MOS-type transistor 22 connected between the output terminal and a high voltage power supply line is forward biased, and a surge current flows from the drain to the ESD protective element 28 via the source (S) and the power supply line. At that time the ESD protective element 28 breaks down based on the characteristics shown in FIG. 2 and leaks the surge current to the ground line.

In order to have the above action performed normally, the ESD protective element 28 is designed so that especially the trigger voltage is greater than the power supply voltage and smaller than the trigger voltage of the IGBT 25 and that the IGBT 25 is always protected. The reasons are as follows. If the trigger voltage of the ESD protective element 28 is smaller than the power supply voltage, the ESD protective element 28 immediately snaps back, and a current continues to flow from the power supply line, leading to thermal destruction. On the other hand, if the trigger voltage of the ESD protective element 28 is larger than the trigger voltage of the IGBT 25, the IGBT 25 may be destroyed first by a surge.

As explained in the first embodiment, this kind of design can be achieved by adjustments of the N-type impurity concentrations of the N-type first semiconductor region 16 or 18 and the N-type second semiconductor region 10, and pattern adjustments of the first electrode 12 and the conductive plate 19 as field plates. If the ESD protective element 28 is appropriately designed, the trigger voltage of the ESD protective element 28 is lower than the trigger voltage of the IGBT 25, so that a surge current flows primarily to the side of the ESD protective element 28, and the IGBT 25 is protected against destruction. It is especially desired to set the trigger voltage of the ESD protective element 28 slightly lower than that of the IGBT 25. In this manner, by adding the ESD protective element 28 of the present invention to a circuit, the channel width of the IGBT 25 can be reduced without strictly considering the ESD tolerance, and the chip area can be easily reduced.

In the ESD protective element 28 there is no need to set the trigger voltage (or breakdown voltage) to be larger than the power supply voltage of the circuit for raising the low holding voltage above the power supply voltage as in the conventional ESD protective elements, and the margin between the power supply voltage and the trigger voltage can be reduced. Therefore, the trigger voltage of the ESD protective element 28 can be set slightly lower than the trigger voltage of the IGBT 25. Because there is no need in the ESD protective element 28 to set the breakdown voltage $BV_{CEO}$ significantly larger than the power supply voltage, the chip size can be kept small.

Figure 6:
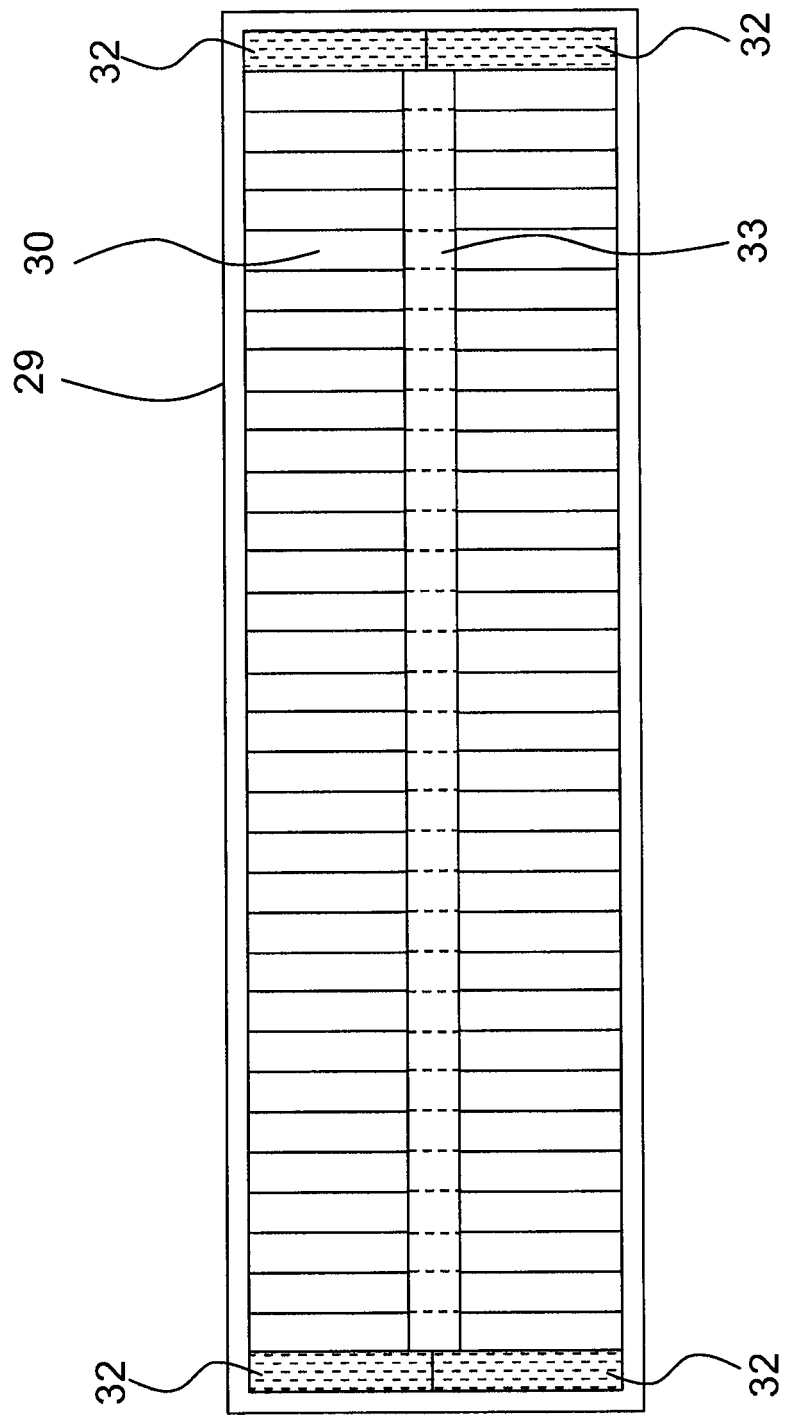
FIG. 6 is an outline planar layout of a PDP scan driver IC of the third embodiment of the present invention.
Figure 7:
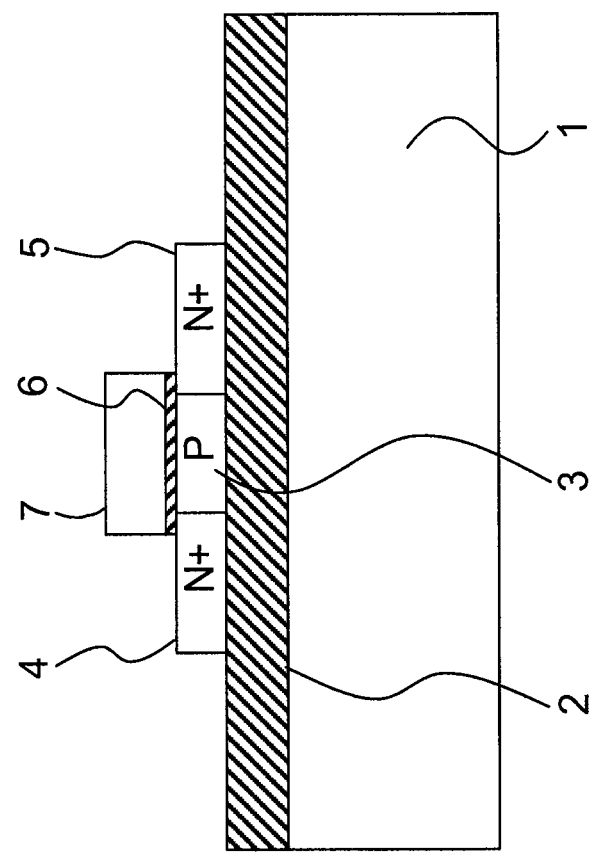
FIG. 7 is a cross-sectional view of a conventional MOS-type ESD protective transistor having an SOI structure.
Figure 10:
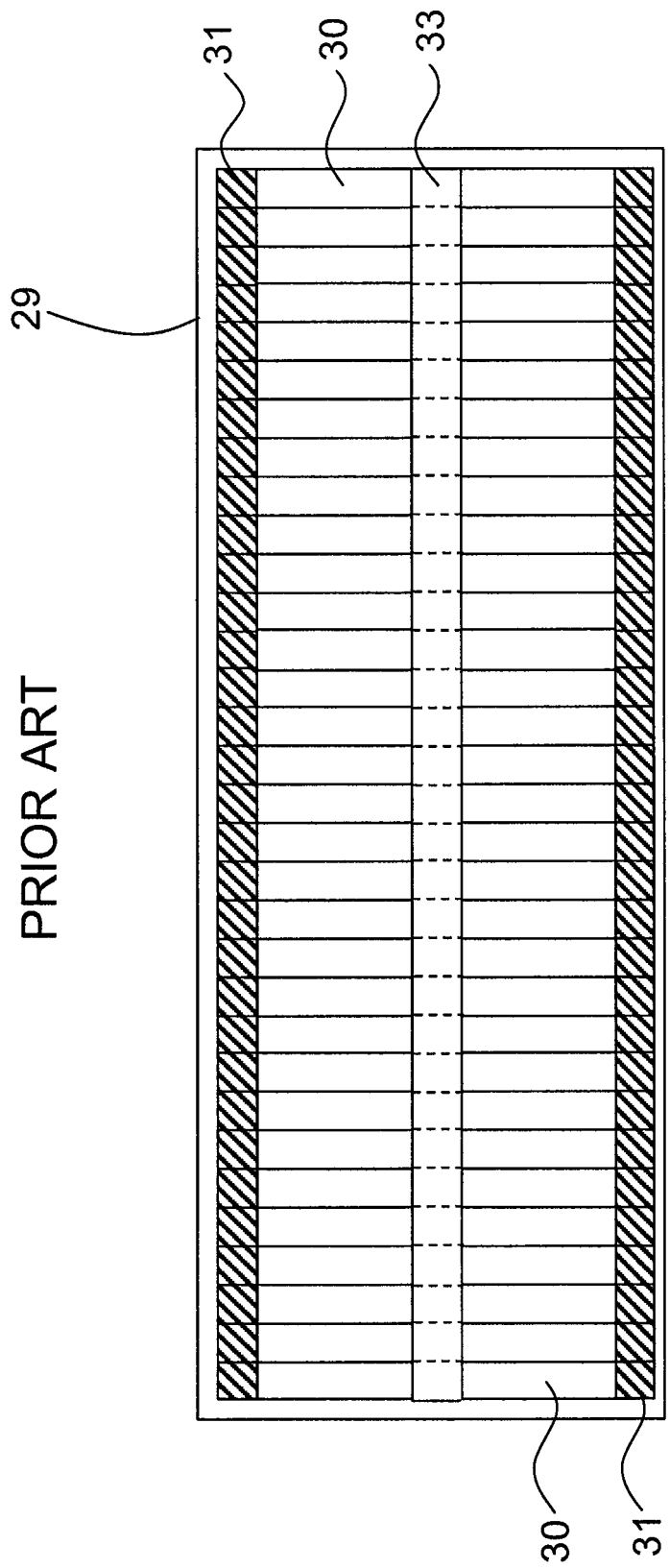
FIG. 10 is an outline planar layout of a conventional PDP scan driver IC.

The ESD protective element according to the present invention also has an advantage in that the increase of its own occupied area on a high voltage integrated circuit chip can be suppressed. Shown in FIG. 6 is a chip outline plan layout view showing an example of placing ESD protective elements inside a high voltage semiconductor integrated circuit (PDP scan driver) chip. Similarly to a conventional chip shown in FIG. 10, multiple unit circuit cells are arranged horizontally and vertically with the scan driver circuit in FIG. 9 as the unit circuit cell in a region 30 for forming high voltage semiconductor circuits constituted of an a transistor 22, an IGBT 25, a diode 26, and transistors 20~24, and a region 33 for forming low voltage semiconductor circuits such as a 5V-system CMOS control circuit 27. One of the unit circuit cell is assigned to one high voltage semiconductor circuit formation region 30 and one low voltage semiconductor circuit formation region 33.

In the chip layout according to the present invention, in addition to the unit circuit cell array, a total of four of the ESD protective elements in at least one of FIGS. 1, 3, and 4 are placed in the ESD protective element formation regions 32 located at two spots each on both left and right ends of a chip 29, and they are commonly connected in parallel to the power lines and the ground lines for the unit circuit cells. Because the high voltage semiconductor integrated circuit according to the present invention has only four ESD protective elements built in, the increase in area of the chip 29 with ESD protective elements can be suppressed. As seen in FIG. 2, because the current capacity of this ESD protective element against ESD is large, even if surge currents are input simultaneously to the output terminals of multiple circuit cells, a small number of ESD protective elements can protect the circuit elements without destroying themselves.

In one case, the sizes of high voltage/high power elements (such as IGBT and high breakdown voltage MOS-type transistor channel widths) constituting the output stage (or input stage) of a high voltage semiconductor integrated circuit are reduced to reduce the occupied area. As a result, to compensate the reduced ESD tolerance of those high voltage/high power elements, ESD protective elements are needed. In this case, by the third embodiment of the present invention, only several, at least a smaller number than the number of circuit cells, ESD protective elements are inserted to the chip. Therefore, even if the size of the ESD protective element of the present invention becomes larger than those of conventional ones in order to provide a sufficient ESD tolerance, the increase in the chip area can be suppressed. In semiconductor integrated circuit devices having many high voltage input/output circuits or input/output terminals, the effect of saving the chip area is especially great. Thus, a high voltage semiconductor integrated circuit having a smaller chip area, higher reliability, and lower cost can be obtained by the present invention, and if being a PDP scan driver, it can contribute to cost reduction of plasma display devices.

The ESD element according to the present invention and the layout of high voltage semiconductor integrated circuit devices with this ESD element built in are not limited to the scan drivers explained in the embodiments but can be applied to other semiconductor devices in order to achieve similar objectives to those of the present invention.

What is claimed is:

1. An ESD protective element providing:
    a semiconductor layer including:
    a first semiconductor region of a first conduction type formed in said semiconductor layer;
    a first semiconductor region of a second conduction type formed in said semiconductor layer in proximity or next to said first semiconductor region of the first conduction type;
    a second semiconductor region of the second conduction type formed in said first semiconductor region of the second conduction type; and
    a second semiconductor region of the first conduction type formed in said second semiconductor region of the second conduction type and spaced apart from said first semiconductor region of the first conduction type,
    wherein an impurity concentration in said second semiconductor region of the second conduction type is higher than an impurity concentration in said first semiconductor region of the second conduction type, and
    said first semiconductor region of the second conduction type and said second semiconductor region of the second conduction type have no electrode connected.

2. The ESD protective element according to claim 1, wherein said semiconductor layer is formed on an insulating film installed on a supporting substrate.

3. The ESD protective element according to claim 1 further providing:
    a first electrode connecting to said first semiconductor region of the first conduction type;
    a second electrode connecting to said second semiconductor region of the first conduction type; and
    an interlayer insulating film covering the upper part of said first semiconductor region of the second conduction type,
    wherein said first electrode extends onto said first semiconductor region of the second conduction type toward said second semiconductor region of the first conduction type via said interlayer insulating film.

4. The ESD protective element according to claim 1 further providing:
    a first electrode connecting to said first semiconductor region of the first conduction type;
    a second electrode connecting to said second semiconductor region of the first conduction type;
    a field insulating film covering the upper part of said first semiconductor region of the second conduction type;
    an interlayer insulating film formed on said field insulating film; and
    a conductive plate installed between said field insulating film and said interlayer insulating film and above said first semiconductor region of the second conduction type,
    wherein said first electrode is electrically connected with said conductive plate.

5. The ESD protective element according to claim 1, wherein said first conduction type is the P type and said second conduction type the N type.

6. A plasma display device having the ESD protective element according to claim 1.

7. A semiconductor device comprising the ESD protective element according to claim 1 and a semiconductor circuit formed in said semiconductor layer and protected by said ESD protective element.

8. The semiconductor device according to claim 7, wherein said first semiconductor region of the first conduction type of said ESD protective element is electrically connected to the ground line of said semiconductor circuit, and said second semiconductor region of the first conduction type of said ESD protective element is electrically connected to the power supply line of said semiconductor circuit.

9. The semiconductor device according to claim 7, wherein said semiconductor circuit comprises multiple unit circuit cells, and the number of said ESD protective elements built in said semiconductor device is smaller than the number of said unit circuit cells.

10. A plasma display device having a semiconductor device according to claim 7.

11. An ESD protective element providing:
    a semiconductor layer including:
    a first semiconductor region of a second conduction type formed in said semiconductor layer;
    a first semiconductor region of a first conduction type formed in said first semiconductor region of the second conduction type;
    a second semiconductor region of the second conduction type formed in said first semiconductor region of the second conduction type and spaced apart from said first semiconductor region of the first conduction type; and
    a second semiconductor region of the first conduction type formed in said second semiconductor region of the second conduction type and spaced apart from said first semiconductor region of the first conduction type,
    wherein an impurity concentration in said second semiconductor region of the second conduction type is higher than an impurity concentration in said first semiconductor region of the second conduction type, and
    said first semiconductor region of the second conduction type and said second semiconductor region of the second conduction type have no electrode connected.

12. The ESD protective element according to claim 11, wherein said semiconductor layer is formed on an insulating film installed on a supporting substrate.

13. The ESD protective element according to claim 11 further providing:
    a first electrode connecting to said first semiconductor region of the first conduction type;

a second electrode connecting to said second semiconductor region of the first conduction type; and an interlayer insulating film covering the upper part of said first semiconductor region of the second conduction type, wherein said first electrode extends onto said first semiconductor region of the second conduction type toward said second semiconductor region of the first conduction type via said interlayer insulating film.

14. The ESD protective element according to claim 11 further providing:

a first electrode connecting to said first semiconductor region of the first conduction type;

a second electrode connecting to said second semiconductor region of the first conduction type;

a field insulating film covering the upper part of said first semiconductor region of the second conduction type;

an interlayer insulating film formed on said field insulating film; and a conductive plate installed between said field insulating film and said interlayer insulating film and above said first semiconductor region of the second conduction type, wherein said first electrode is electrically connected with said conductive plate.

15. The ESD protective element according to claim 11, wherein said first conduction type is the P type and said second conduction type the N type.

16. A plasma display device having the ESD protective element according to claim 11.

17. A semiconductor device comprising the ESD protective element according to claim 11 and a semiconductor circuit formed in said semiconductor layer and protected by said ESD protective element.

18. The semiconductor device according to claim 17, wherein said first semiconductor region of the first conduction type of said ESD protective element is electrically connected to the ground line of said semiconductor circuit, and said second semiconductor region of the first conduction type of said ESD protective element is electrically connected to the power supply line of said semiconductor circuit.

19. The semiconductor device according to claim 17, wherein said semiconductor circuit comprises multiple unit circuit cells, and the number of said ESD protective elements built in said semiconductor device is smaller than the number of said unit circuit cells.

20. A plasma display device having a semiconductor device according to claim 17.

* * * * *